(12) United States Patent
Chang et al.

(10) Patent No.: US 7,902,512 B1
(45) Date of Patent: Mar. 8, 2011

(54) COPLANAR HIGH FILL FACTOR PIXEL ARCHITECTURE

(75) Inventors: Jeff Hsin Chang, Rochester, NY (US); Timothy J. Tredwell, Fairport, NY (US); Gregory N. Heiler, Hilton, NY (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 12/630,959

(22) Filed: Dec. 4, 2009

(51) Int. Cl.
*G01T 1/24* (2006.01)

(52) U.S. Cl. .................................................. 250/370.01

(58) Field of Classification Search ............ 250/370.01–370.15, 363.01–363.1; 378/98.8; 257/59, 72, 291, 292, 293, E27.131
See application file for complete search history.

(56) References Cited

U.S. PATENT DOCUMENTS

| | | | |
|---|---|---|---|
| 5,262,649 A | | 11/1993 | Antonuk et al. |
| 5,352,921 A | * | 10/1994 | Codama et al. ............... 257/448 |
| 6,300,159 B1 | * | 10/2001 | Mochizuki ...................... 438/67 |
| 6,724,010 B1 | * | 4/2004 | Kwasnick et al. .............. 257/59 |
| 7,615,731 B2 | * | 11/2009 | Heiler et al. ................ 250/214.1 |
| 7,619,197 B2 | | 11/2009 | Tredwell et al. |
| 2004/0159794 A1 | * | 8/2004 | Morii et al. ............... 250/370.11 |
| 2005/0017189 A1 | * | 1/2005 | Homma et al. .......... 250/370.11 |
| 2005/0092986 A1 | * | 5/2005 | Couture et al. .................. 257/48 |
| 2007/0045552 A1 | * | 3/2007 | Masazumi ............... 250/370.09 |
| 2007/0075247 A1 | * | 4/2007 | Mochizuki ..................... 250/362 |
| 2007/0164333 A1 | * | 7/2007 | Wright .......................... 257/292 |
| 2008/0237474 A1 | * | 10/2008 | Tonotani et al. .......... 250/363.01 |
| 2009/0230311 A1 | * | 9/2009 | Mochizuki et al. ....... 250/370.09 |

OTHER PUBLICATIONS

Fann et al., "Operating principles and performance of a novel A-Si:H PIN-Based X-ray detector for medical imaging applications," 2003, IEEE Transactions on Electron Devices, vol. 50, No. 2 pp. 341-185.*
Okamura et al., "A light-transmitting two-dimensional photodetector array using a-Si PIN photodiodes and poly-Si TFT's integrated on a transparent substrate," 1994, IEEE Transactions on Electron Devices, vol. 41, No. 2, pp. 180-185.*
Selection of a-Si:H Array Operating Parameters For Medical Imaging Applications, J. Yorkston et al., Department of Radiation Oncology, University of Michigan Medical Center, Ann Arbor, MI 48109, pp. 266 and 274.
Amorphous Silicon Image Sensor Arrays, Mat. Res. Soc. Symp. Proc., vol. 258, 1992 Materials Research Society, pp. 1127-1129.

* cited by examiner

*Primary Examiner* — David P Porta
*Assistant Examiner* — Kiho Kim

(57) ABSTRACT

A pixel comprising a scan line proximate to a first surface of a substrate and a bias line between the first surface of the substrate and a first terminal of a photosensing element, where a portion of the bias line is substantially parallel to the scan line. The pixel can also comprise a switching element proximate to the first surface of the substrate and aligned with at least a portion of the scan line. The pixel can include the photosensing element proximate to the first surface of the substrate and aligned with at least a portion of the bias line.

28 Claims, 18 Drawing Sheets

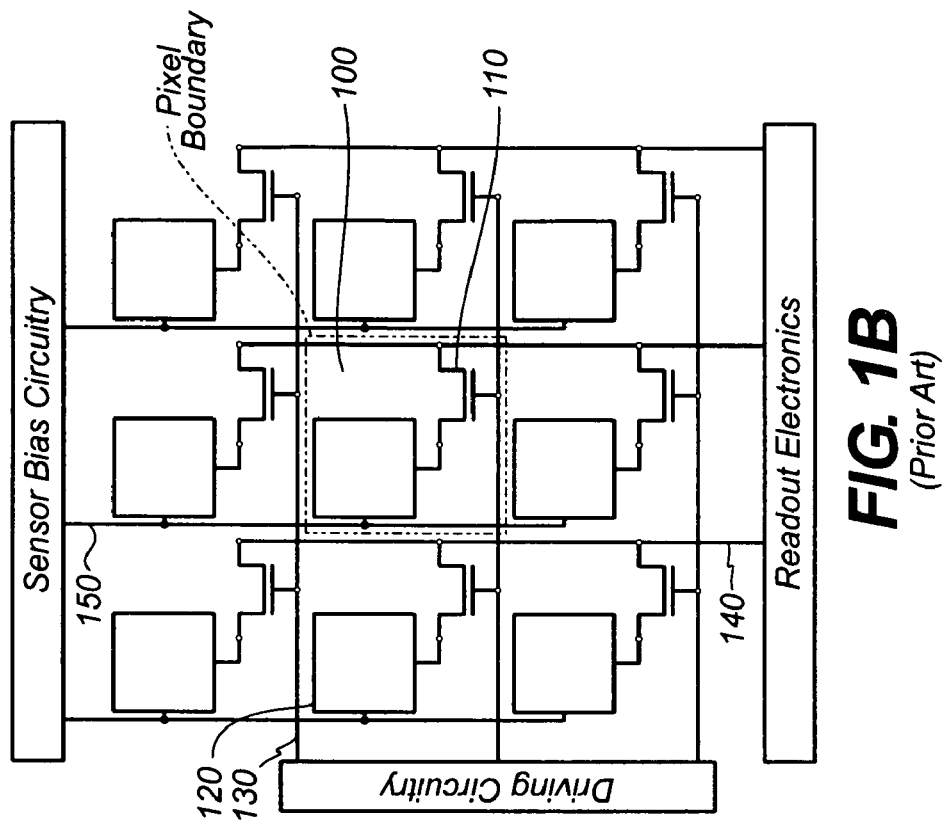
FIG. 1B *(Prior Art)*
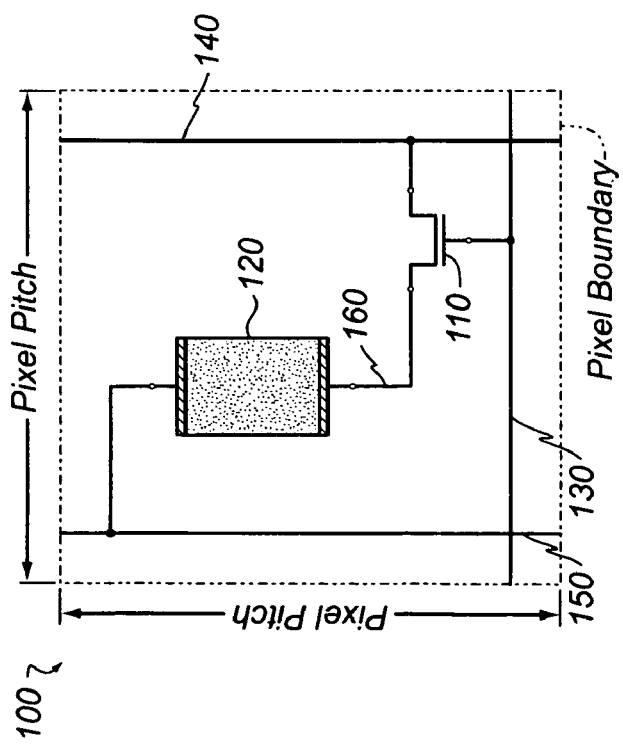
FIG. 1A *(Prior Art)*

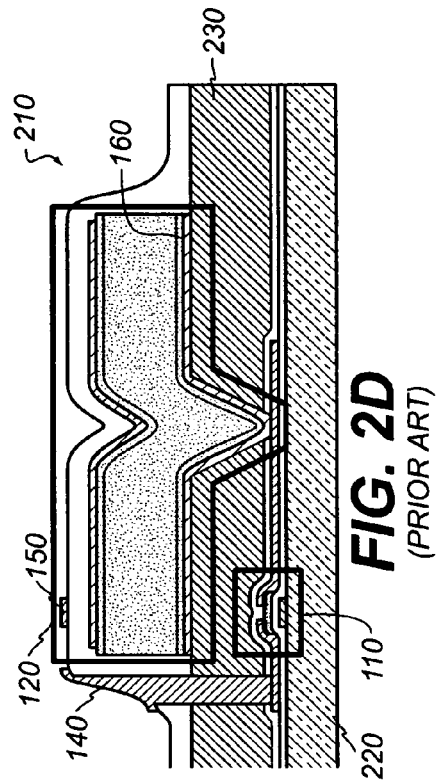
FIG. 2A (PRIOR ART)
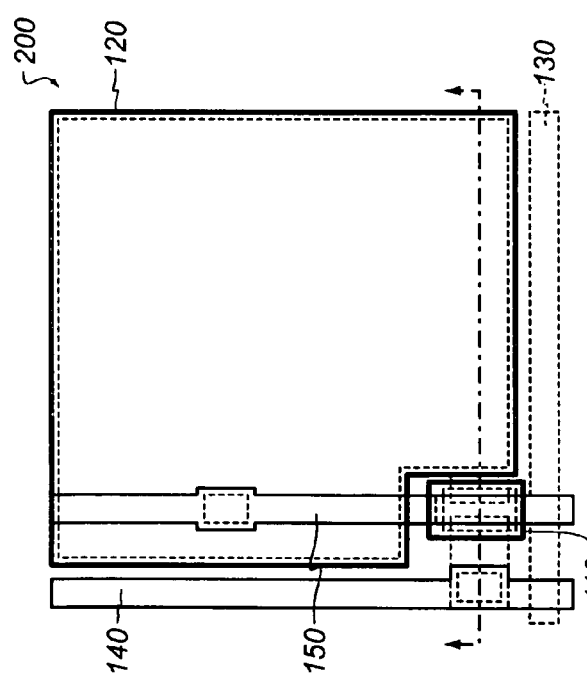
FIG. 2B (PRIOR ART)
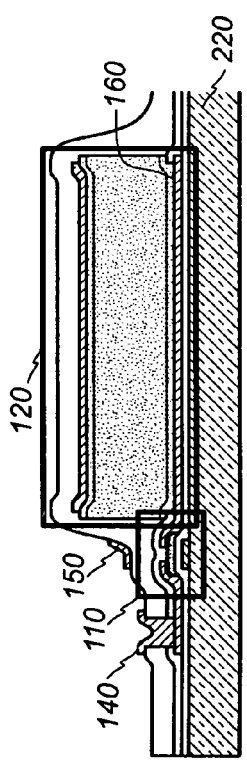
FIG. 2C (PRIOR ART)
FIG. 2D (PRIOR ART)

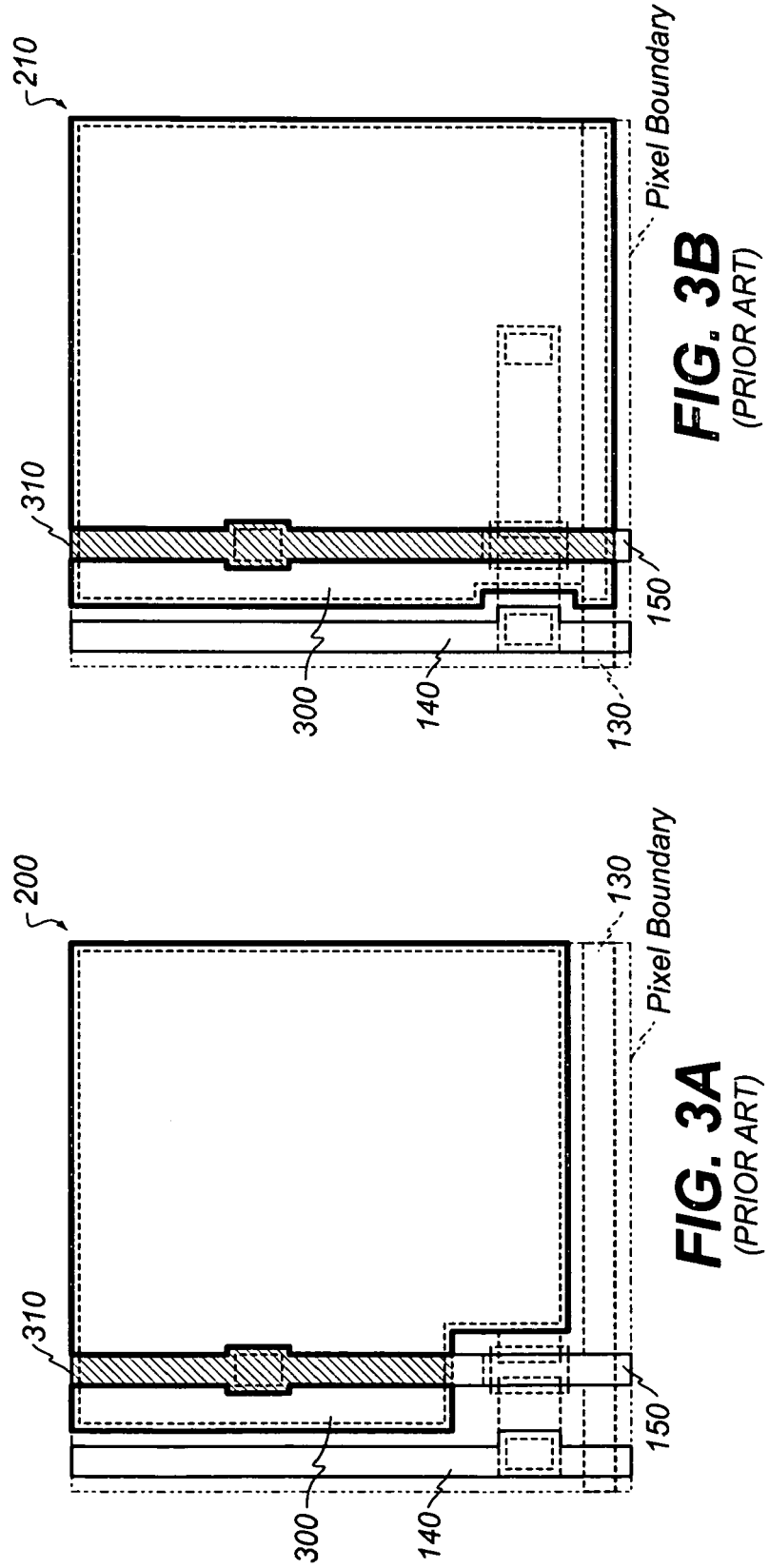

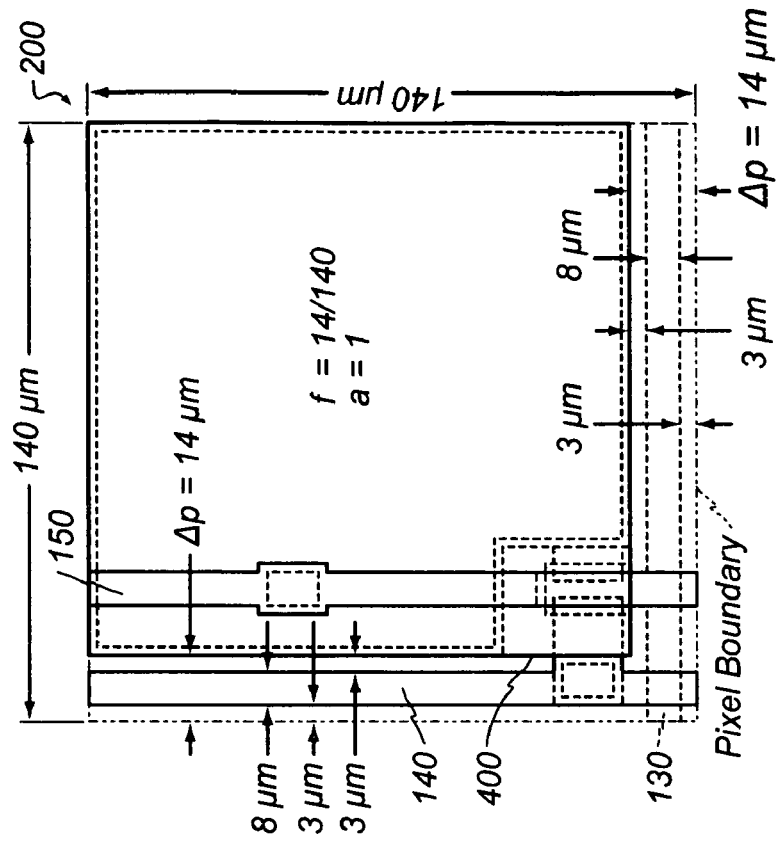
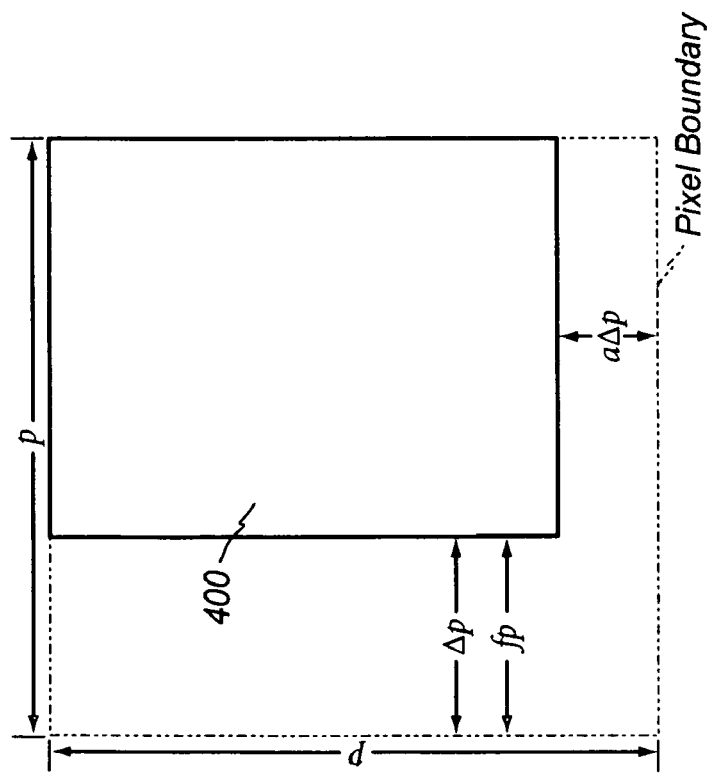
FIG. 4B
FIG. 4A

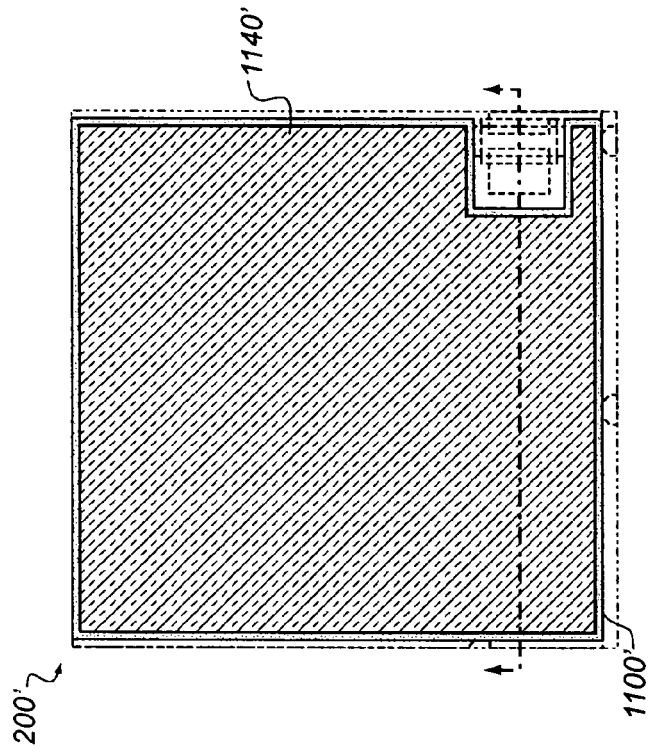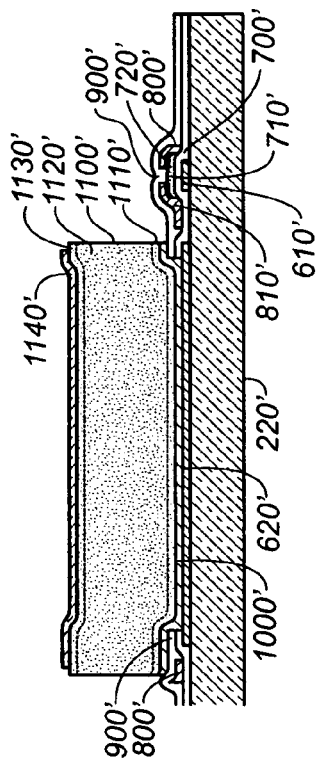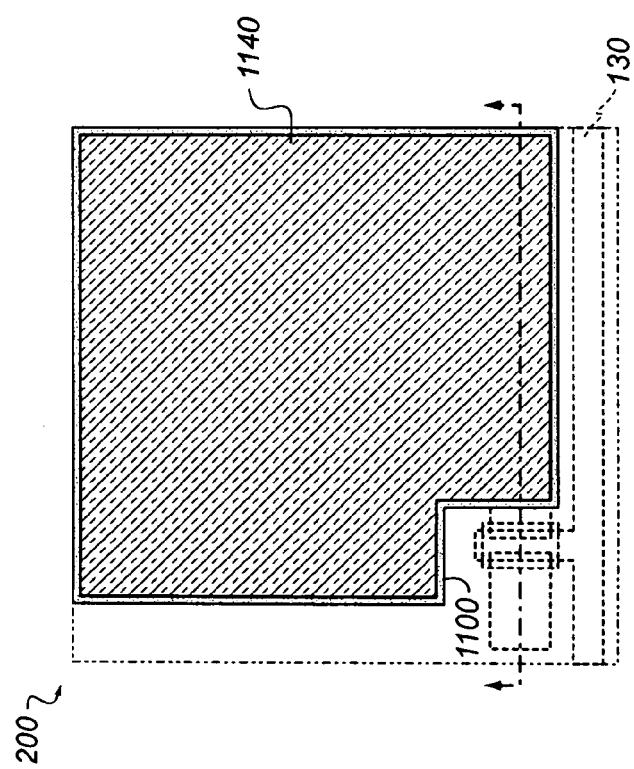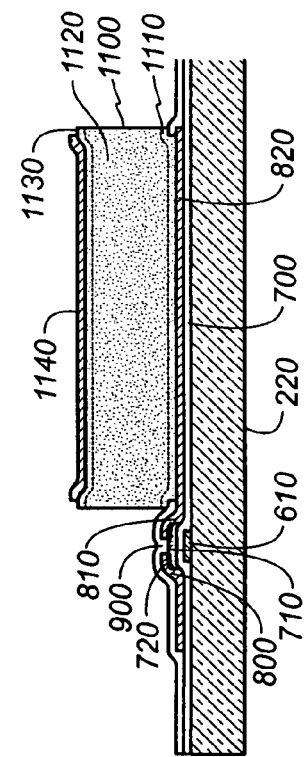

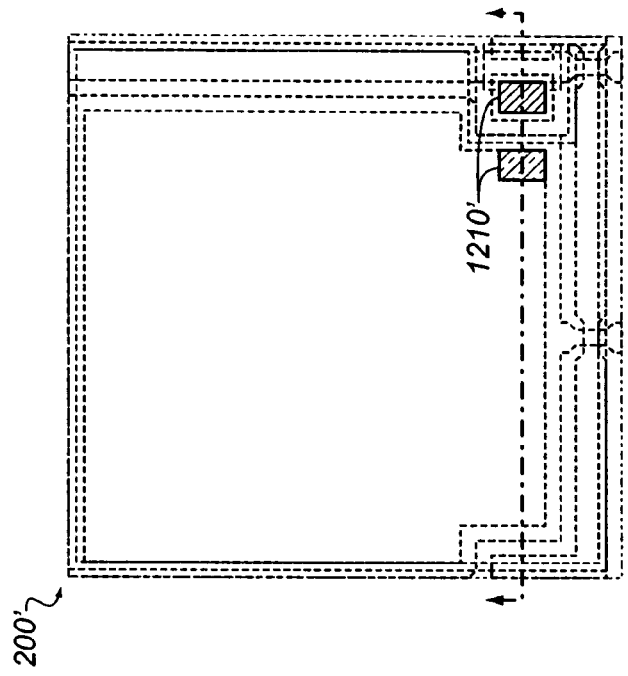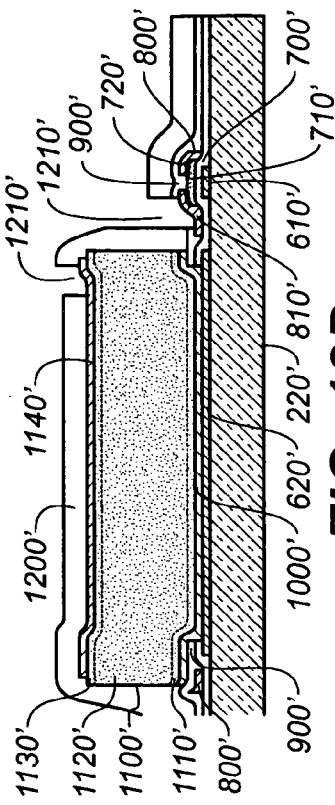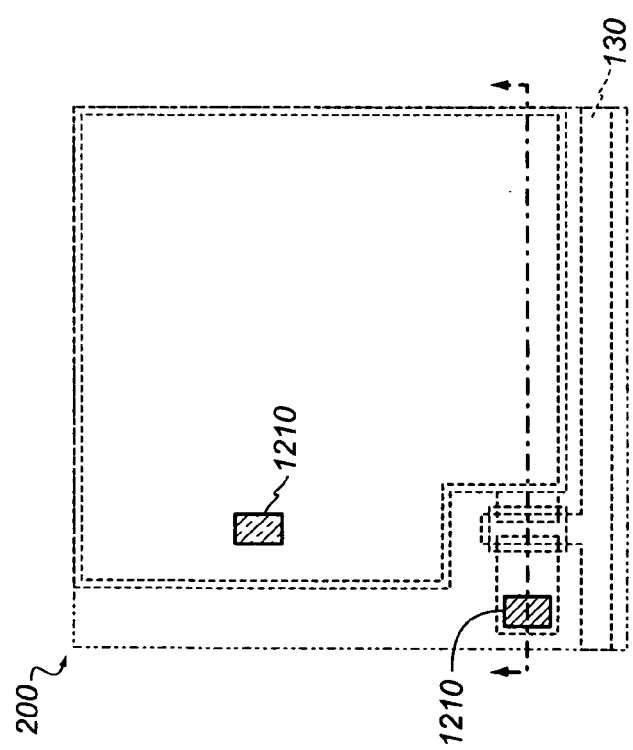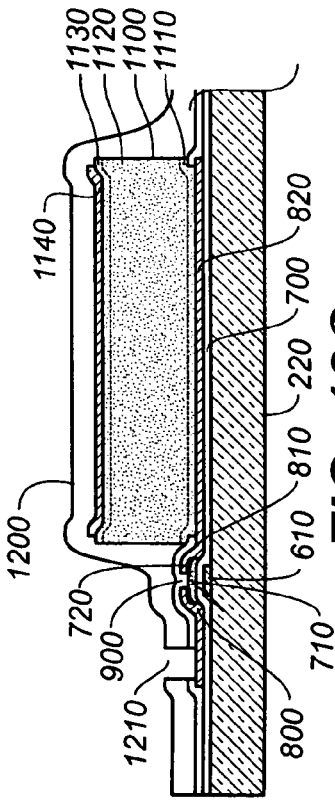
FIG. 12A
FIG. 12B
FIG. 12C
FIG. 12D

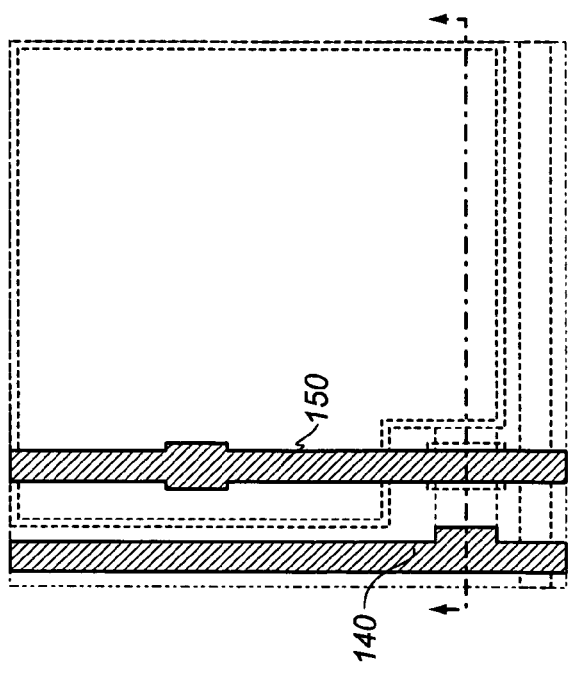
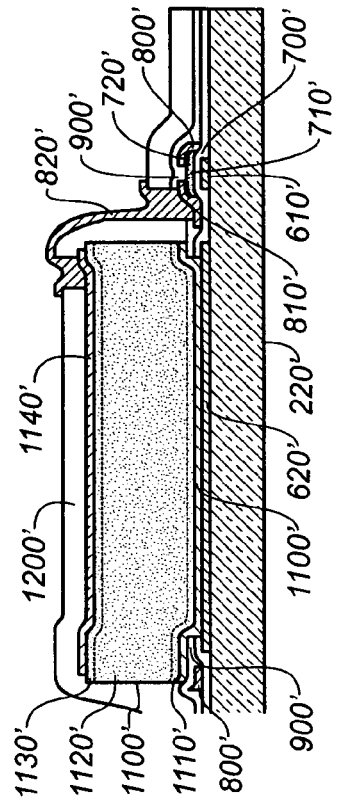
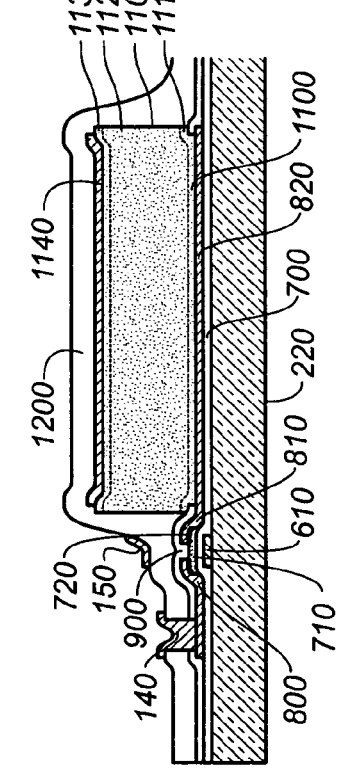

COPLANAR HIGH FILL FACTOR PIXEL ARCHITECTURE

FIELD OF THE INVENTION

The present invention relates to pixels used in imaging arrays. More specifically, the invention relates to coplanar pixels having relatively high fill factor suitable for use in visible and X-ray image sensing applications, which can include medical diagnostics, non-destructive inspection, etc.

BACKGROUND OF THE INVENTION

Imaging arrays comprised of multiple sensor pixels 100 are well known in the imaging art. Sensor pixels 100 typically include a switching element 110 such as a thin-film transistor (TFT) and a photoelectric conversion element 120 such as a photodiode. FIG. 1A shows a schematic equivalent pixel circuit for sensor pixels 100. The photoelectric conversion element 120 is sensitive to incident radiation and can generate a number of charge carriers where the number depends on the radiation dosage. In imaging arrays composed of a plurality of pixels, the photogenerated carriers are usually temporarily stored either across the internal capacitance of the sensor or in an on-pixel storage capacitor prior to readout. A signal of interest is usually represented by a potential change in the floating node 160 of the pixel. A task of the switching element 110 is to maintain the signal within the pixel and subsequently release the photogenerated carriers for readout. Aside from the two device elements 110, 120, the signal lines are also crucial to the functionality of the sensor pixel and the imaging array. The switching element 110 is controlled by scan line 130 that dictates the time and duration of the signal charge release process. The data line 140 provides a path for the charge carriers to the readout electronics. The bias line 150 provides the appropriate bias voltages for the photoelectric conversion elements 120.

A plurality of sensor pixels can be tiled in a matrix fashion to form an imaging array. FIG. 1B shows a schematic equivalent circuit of a 3×3 pixels imaging array that can be used for a general radiation detection device. The data line 140 is shared between pixels in each column and is connected to the readout electronics. The scan line 130 is shared between pixels in each row and is connected to the driving electronics. The driving circuitry provides the appropriate signals on scan lines 130 to release the signals stored on the floating nodes 160 of pixels 100 to the data lines 140 one row at a time, usually in sequence.

Two sensor pixel 100 architectures well known in the imaging art are the coplanar pixel 200 and the vertically-integrated pixel 210 shown in FIGS. 2A, 2C and 2B, 2D, respectively. Coplanar pixel 200 differs from the vertically-integrated pixel 210 in that a portion of the photoelectric conversion device 120 is not situated on top of the switching element 110. FIG. 2A and FIG. 2C illustrate a top-down view and a cross-sectional view of a coplanar pixel 200, respectively. FIG. 2B and FIG. 2D illustrates the top-down view and cross-sectional view of a vertically-integrated pixel 210, respectively. In both cases, the switching element 110 is an inverted-staggered back-channel-etch (BCE) TFT commonly found in the liquid crystal display (LCD) backplane technology, and the photoelectric conversion device 120 is a p-i-n photodiode. The approximate regions of the switching elements 110 and the photoelectric conversion elements 120 are highlighted by the thick bounding boxes in FIGS. 2A-2D. In the coplanar pixel design 200, the TFT 110 and photodiode 120 are situated parallel to one another on a substrate 220, for example, glass. In the vertically-integrated pixel design 210, a relatively thick layer of inter-layer dielectric insulator material 230 is sandwiched between a portion of the photodiode 120 and the TFT 110.

There is a general desire to achieve higher pixel sensitivity; doing so could either lower the required radiation dosage while maintaining similar readout signal levels, or maintaining the same radiation dosage to obtain higher readout signal levels. The output signal-to-noise ratio (SNR) is boosted with an increase in output signal level while having the same output noise level. Higher output SNR can provide improved discrimination between features of interest and unwanted noise in the image.

One key factor that influences the pixel sensitivity is the pixel fill factor (FF). FIG. 3A shows a top-down view of a coplanar pixel 200 and FIG. 3B shows a top-down view of a vertically-integrated pixel 210. The fill factor of a pixel can be approximated as the ratio of the photosensitive area of the pixel 300 to the total pixel area (marked by the pixel boundary in FIG. 3A and FIG. 3B). In both FIG. 3A and FIG. 3B, the photosensitive area 300 of the pixel is highlighted by thick bounding boxes. Portions of the photoelectric conversion element 120 covered by the bias line 150 (marked by hatched region 310) are often not considered as photosensitive since the composition of metal used for the bias line 150 is usually substantially opaque to incident photons energies. As shown by comparing FIG. 3A and FIG. 3B, generally, higher fill factors can be obtained in vertically-integrated pixel 210 as compared to coplanar pixel 200. However, issues related with the vertically-integrated pixel architecture 210, for example, added layer stress and degraded sensor performance due to large variation in underlying topology (illustrated in FIG. 2D), can make the coplanar pixel 200 the preferred pixel architecture. Therefore, there is a strong desire to achieve higher pixel fill factor for coplanar pixels.

Due to various limitations imposed by the fabrication process of the imaging array, for example, minimum feature size, the pixel fill factor does not stay constant with varying pixel sizes. The pixel fill factor generally decreases with decreasing pixel pitch and this reduction can be more severe for smaller pixel sizes. Imaging array resolution requirements for single-shot general radiography applications for example, can require pixel pitch to be in the range of about 120 µm to about 150 µm; while for specialized applications such as mammography, the demand for finer pixel pitch can be in the range of about 40 µm to about 80 µm.

In view of the issues described above, the object of the present invention is to improve the coplanar pixel sensitivity by achieving higher fill factor. Another object of the present invention is to improve the coplanar pixel sensitivity for smaller pixel sizes by achieving smaller reduction in pixel fill factor with reduction in pixel size.

SUMMARY OF THE INVENTION

Embodiments according to the presently taught pixel architectures include relatively high fill factor pixels, manufactured individually and in imaging arrays, and methods of manufacturing the same.

Present teachings include a pixel comprising a scan line proximate to a first surface of a substrate and a bias line between the first surface of the substrate and a first terminal of a photosensing element, where a portion of the bias line is substantially parallel to the scan line. The pixel can also comprise a switching element proximate to the first surface of the substrate and aligned with at least a portion of the scan line. The switching element can include a first terminal, a second terminal, and a gate electrode, where the gate electrode is electrically coupled to the scan line. The first terminal and the second terminal are electrically coupled based on a scan signal from the scan line. Finally, the pixel can include the photosensing element proximate to the first surface of the substrate and aligned with at least a portion of the bias line. The photosensing element can include a first terminal electrically connected to the bias line and a second terminal electrically connected to the first terminal of the switching element.

Another embodiment according to present teachings includes a pixel comprising a scan line proximate to a first surface of a substrate and a bias line between the first surface of the substrate and a first terminal of a photosensing element, where a portion of the bias line is substantially transverse to the scan line. The pixel can also comprise a switching element proximate to the first surface of the substrate and aligned with at least a portion of the scan line. The switching element can include a first terminal, a second terminal, and a gate electrode electrically coupled to the scan line. The first terminal and the second terminal are electrically coupled based on a scan signal from the scan line. Finally, the pixel can include the photosensing element proximate to the first surface of the substrate and aligned with at least a portion of the bias line. The photosensing element can include a first terminal electrically coupled to the bias line and a second terminal electrically coupled to the first terminal of the switching element.

Present teachings also include, that the fill factor (FF) of the pixel can be greater than about 69%, more specifically between about 70% and about 89%. The bias line can be formed in the same metal layer as the scan line. Another embodiment according to present teachings includes that the gate electrode can be formed in the same metal layer as the bias line and the scan line. Also, the bias line can be wider than the scan line and a portion of the photosensing element can be proximate to at least one of a portion of the scan line, a portion of a data line, or a combination thereof. Additional embodiments can include imaging arrays including a plurality of pixels, and a radiation imaging system including at least one imaging array including a plurality of pixels, driving circuits, and readout circuits. The radiation imaging system can also include a phosphor screen.

The photosensing element can be selected from the group of p-i-n photodiodes, p-n junction photodiodes, MIS photosensors, or phototransistors. The switching element can be selected from the group of: MOS thin-film-transistors, junction field-effect-transistors, fully-depleted SOI transistors, partially-depleted SOI transistors, SiOG transistors, bulk MOS transistors, and bi-polar transistors. Also, the photosensing element can include at least one semiconducting layer, and at least one semiconducting layer is selected from the group of: amorphous silicon, micro-crystalline silicon, poly-crystalline silicon, single-crystal silicon, an organic semiconductor, and metal oxide semiconductors. The switching element can include at least one semiconducting layer, and at least one semiconducting layer is selected from the group of amorphous silicon, micro-crystalline silicon, poly-crystalline silicon, single-crystal silicon, an organic semiconductor, and metal oxide semiconductors.

The first terminal of the photosensing element can be a cathode and the second terminal of the photosensing element can be an anode. Alternatively, the first terminal of the photosensing element can be an anode and the second terminal of the photosensing element can be a cathode. The pixel can also include an additional metal layer between the bias line and the photosensing element.

Embodiments of the present invention can also include imaging arrays comprising a plurality of pixels as previously discussed, electrically coupled in rows and columns where the scan line and the bias line are common to the plurality of pixels.

BRIEF DESCRIPTION OF THE DRAWINGS

Various features of the embodiments can be more fully appreciated as the same become better understood with reference to the following detailed description of the embodiments when considered in connection with the accompanying figures.

FIG. 1A shows a schematic equivalent pixel circuit for a sensor pixel utilized in known imaging arrays.

FIG. 1B shows a 3×3 pixel imaging array used for known general radiation detection devices.

FIG. 2A shows a top-down view of a conventional coplanar pixel 200.

FIG. 2B shows a top-down view of a conventional vertically-integrated pixel 210.

FIG. 2C shows a cross-sectional view of a conventional coplanar pixel 200.

FIG. 2D shows a cross-sectional view of a conventional vertically-integrated pixel 210.

FIG. 3A shows the top-down view of FIG. 2A highlighting the photosensitive area 300 of pixel 200.

FIG. 3B shows the top-down view of FIG. 2B highlighting the photosensitive area 300 of pixel 210.

FIG. 4A shows an abstract view of a conventional coplanar pixel 200 of FIG. 4B.

FIG. 4B shows an example top-down view of a conventional coplanar pixel 200.

FIG. 6A to FIG. 13A illustrate top-down views of a conventional coplanar pixel at various steps of a conventional coplanar pixel manufacturing process.

FIG. 6B to FIG. 13B illustrate top-down views of a pixel according to present teachings at various steps of a pixel manufacturing process according to present teachings.

FIG. 6C to FIG. 13C illustrate cross-sectional views of a conventional coplanar pixel corresponding to the top-down views of FIGS. 6A-13A.

FIG. 6D to FIG. 13D illustrates cross-sectional views of the pixel corresponding to top-down views of FIGS. 6B-13B.

DETAILED DESCRIPTION OF THE INVENTION

Figure 5:
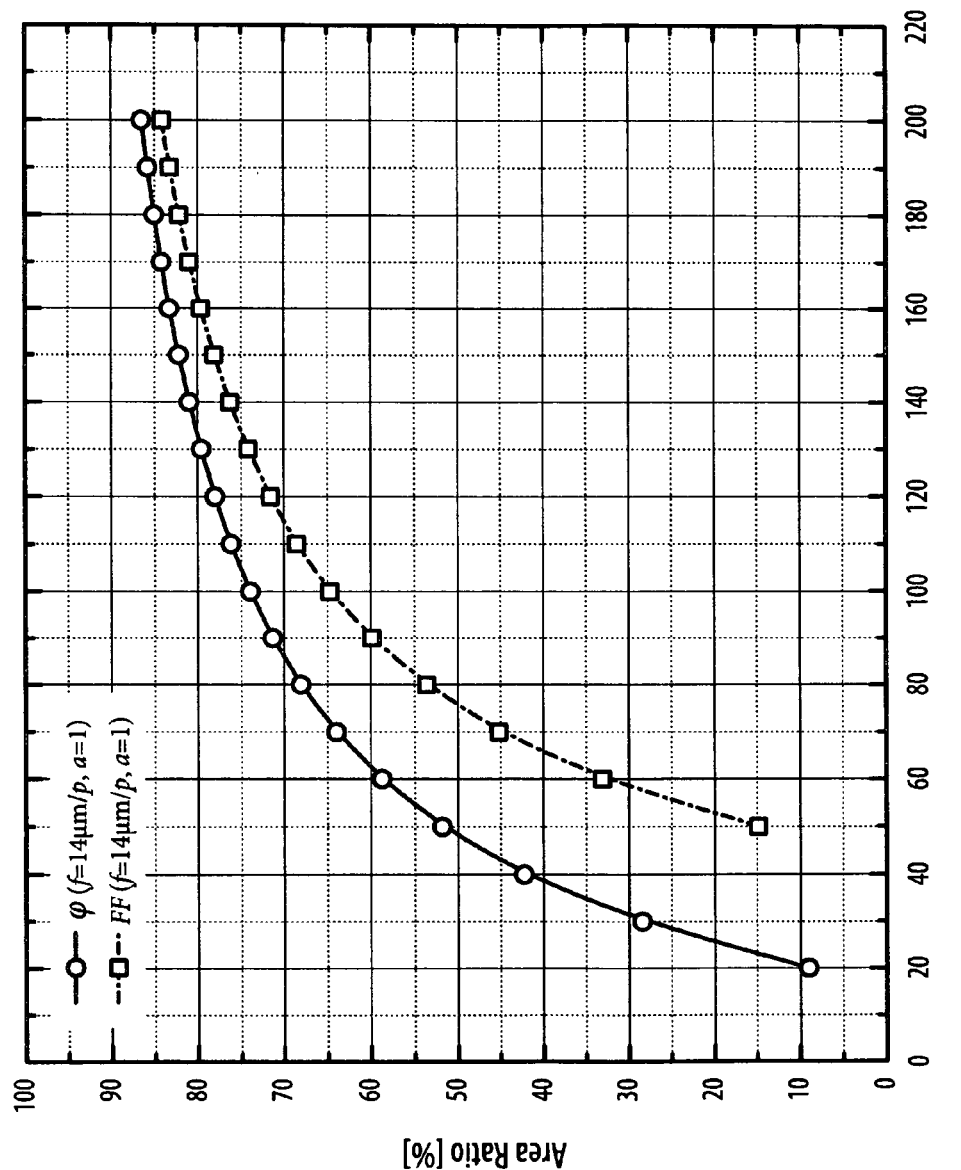
FIG. 5 shows the dependence of device area 400 to pixel area ratio and photosensitive area 300 to pixel area ratio on pixel size.

Reference will now be made in detail to the present embodiments (exemplary embodiments) of the invention, an example of which is illustrated in the accompanying drawings. Wherever possible, the same reference numbers will be used throughout the drawings to refer to the same or like parts.

For simplicity and illustrative purposes, the principles of the present invention are described by referring mainly to exemplary embodiments thereof. However, one of ordinary skill in the art would readily recognize that the same principles are equally applicable to, and can be implemented in, all types of secure distributed environments and that any such variations do not depart from the true spirit and scope of the present invention. Moreover, in the following detailed description, references are made to the accompanying figures, which illustrate specific embodiments. Electrical, mechanical, logical and structural changes can be made to the embodiments without departing from the spirit and scope of the present invention. The following detailed description is, therefore, not to be taken in a limiting sense and the scope of the present invention is defined by the appended claims and their equivalents.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value equal to or greater than zero and a maximum value equal to or less than 10, e.g., 1 to 5.

Pitch, as used herein, is defined as the length or repeated spacing of a given element. For example, pixel pitch is used herein to describe the repeating distance between each pixel in an array of pixels. An imaging element or pixel can include at least one transistor/switching element and at least one photodiode/photoelectric conversion element. A photoelectric conversion element converts electromagnetic radiation from at least one portion of the electromagnetic spectrum, (including gamma rays to infrared radiation), into electrical charge. The fill factor is the percentage of the pixel area that is sensitive to incident photons. Also, individual pixels can be electrically coupled to form an imaging array. The term overlap as used herein is defined as the common space that is covered by two elements.

With reference to the manufacturing process discussed, one skilled in the art will understand that the various layers comprising any type of stacked electrical device can each be deposited to form a pattern, e.g., the pattern being defined by a mask (e.g., of previously formed features, lithography, combinations thereof, etc.), deposited as a non-patterned layer, which is then etched (e.g., by a mask), or combinations thereof. These steps are used in various combinations in order to form a final desired structure. Therefore, for purposes of this discussion the use of the term "to form" (in any conjugation) when discussing pixel manufacturing is intended to include the various depositing/etching/masking techniques known in the art. Also, similar features of the discussed pixels are indicated by the same element number, but elements according to presently taught embodiments are differentiated with "'" following the element number.

Examples of metal and metal layer compositions, as used herein, may include, e.g., Al, Cr, Cu, Mo, Nd, Ti, W, etc., metal alloys with partial composition of these elements (e.g., MoW, AlNd, etc.), stacks thereof, etc.

Embodiments of the present teachings have similar process flows as known conventional architectures, but can yield pixels and pixel arrays having higher fill factors. The embodiments of the presently taught pixel architectures can also offer several improvements in pixel performances which can include improvements in unwanted feedthrough charge to a floating signal node 160 of the pixel due to reduced capacitance coupling and better immunity to electromagnetic interference (EMI), improvements in noise performance of the imaging array by reducing the bias line 150' resistance, and improvements in heat dissipation of imaging array pixels by providing lower thermal resistance paths toward the peripheral regions of the array.

In various embodiments, the presently taught pixels are structured so as to collect holes, which can impact the orientation of the source/drain terminal for TFT switching elements. A relatively high fill factor can be obtained in part due to removal of the bias line routing in the top metal layer, which can also resolve some step coverage problems experienced with the bias lines of conventional designs.

FIG. 4A provides an abstract view of a coplanar pixel 200 shown in FIG. 4B that can be used in conventional radiographic imaging arrays. The device area 400 indicates the approximate area of the pixel used for switching element 110 and photoelectric conversion element 120. The approximate device area is highlighted by a thick bounding box in FIG. 4B. Since the photosensitive area 300 can be a fractional portion of the device area 400, area ratio calculations based on the device area 400 could provide an upper limit value for the fill factor of the coplanar pixel 200.

The pitch of the square coplanar pixel 200 is represented by the variable p. For non-square pixels, the horizontal and vertical pixel pitches can be different. This however does not affect the key points conveyed here through the analysis of square pixels that are most commonly used in general radiographic imaging arrays. Due to various design and fabrication process constraints such as scan line 130 and data line 140 widths, the device area 400 can be limited to only a fraction of the pixel area ($p^2$). The difference is referred to as gap spacing and is designated as $\Delta p$, shown in FIG. 4A. A ratio factor f is used to describe the relative size of $\Delta p$ with respect to the pixel pitch defined by $f=\Delta p/p$. Since $\Delta p$ is smaller than p, the value of f falls in between 0 and 1. Typically, scan lines 130 and data lines 140 are perpendicular to each other. Since the gap spacing requirement for the scan line 130 and the data line 140 can be different, $\Delta p$ is chosen to be the larger of the two; in conjunction, the ratio factor $\alpha$ is used to describe the gap spacing difference by expressing the smaller gap spacing as $\alpha\Delta p$ (also shown in FIG. 4A). The choice of $\Delta p$ as the larger of the two spacing dictates that the value of $\alpha$ be between 0 and 1, where $\alpha=1$ denotes the case when the size of both gap spacings are the same. FIG. 4B provides some example values for the designated variables. For example, the pitch of the coplanar pixel 200 can be about 140 μm. The minimum trace width in the example can be about 8 μm and the minimum spacing required between the traces and the photoelectric conversion element can be about 3 μm. Consequently, $\Delta p=2\times3$ μm$+8$ μm$=14$ μm, and $f=14$ μm/140 μm, where the gap spacing requirement for the scan line 130 and the data line 140 are the same, $\alpha=1$.

The ratio of device area 400 to pixel area ($p^2$), designated as $\phi(f, \alpha)$, can be calculated by $\phi(f, \alpha)=(\alpha f-1)(f-1)$. FIG. 5 shows a plot of $\phi(f, \alpha)$ for various pixel sizes based on the coplanar pixel design shown in FIG. 4B ($\Delta p=14$ μm and $\alpha=1$). The pixel fill factor $FF(f, \alpha)$ (the ratio of photosensitive area 300 to pixel area) is also shown in FIG. 5, which takes into account the device area 400 (e.g., taken by TFT 110) and the bias line 150 area (e.g., covering photodiode 310). For the coplanar pixel design shown in FIG. 3A, the maximum fill factor is limited to about 81%; the actual fill factor is closer to about 76%.

FIG. 5 shows that the maximum fill factor limit $\phi(f, \alpha)$ can drastically reduce with the shrinking of the pixel size, which can be even more true for the actual fill factor $FF(f, \alpha)$. Therefore, it is not only desirable to achieve higher fill factors for particular pixel sizes but it is also desirable to minimize the fill factor reduction caused by shrinking of pixel size.

An embodiment according to the present teachings presents a pixel structure that can utilize the same basic steps of the fabrication process as the known conventional pixel 200 shown in FIG. 2A and FIG. 2C while yielding pixels and pixel arrays with higher fill factors.

Figure 14:
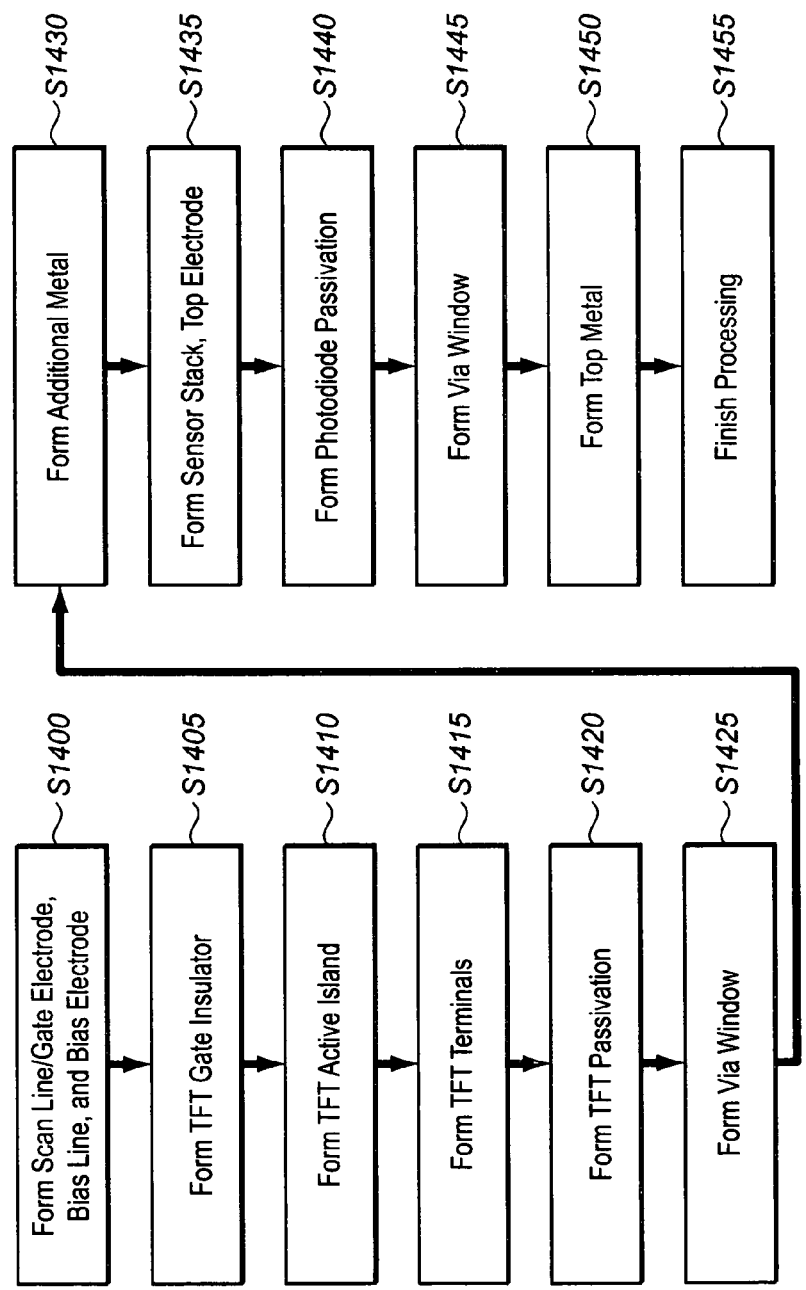
FIG. 14 is a flow diagram summarizing the process flow for features shown in FIGS. 6B-13B and 6D-13D.
Figure 15:
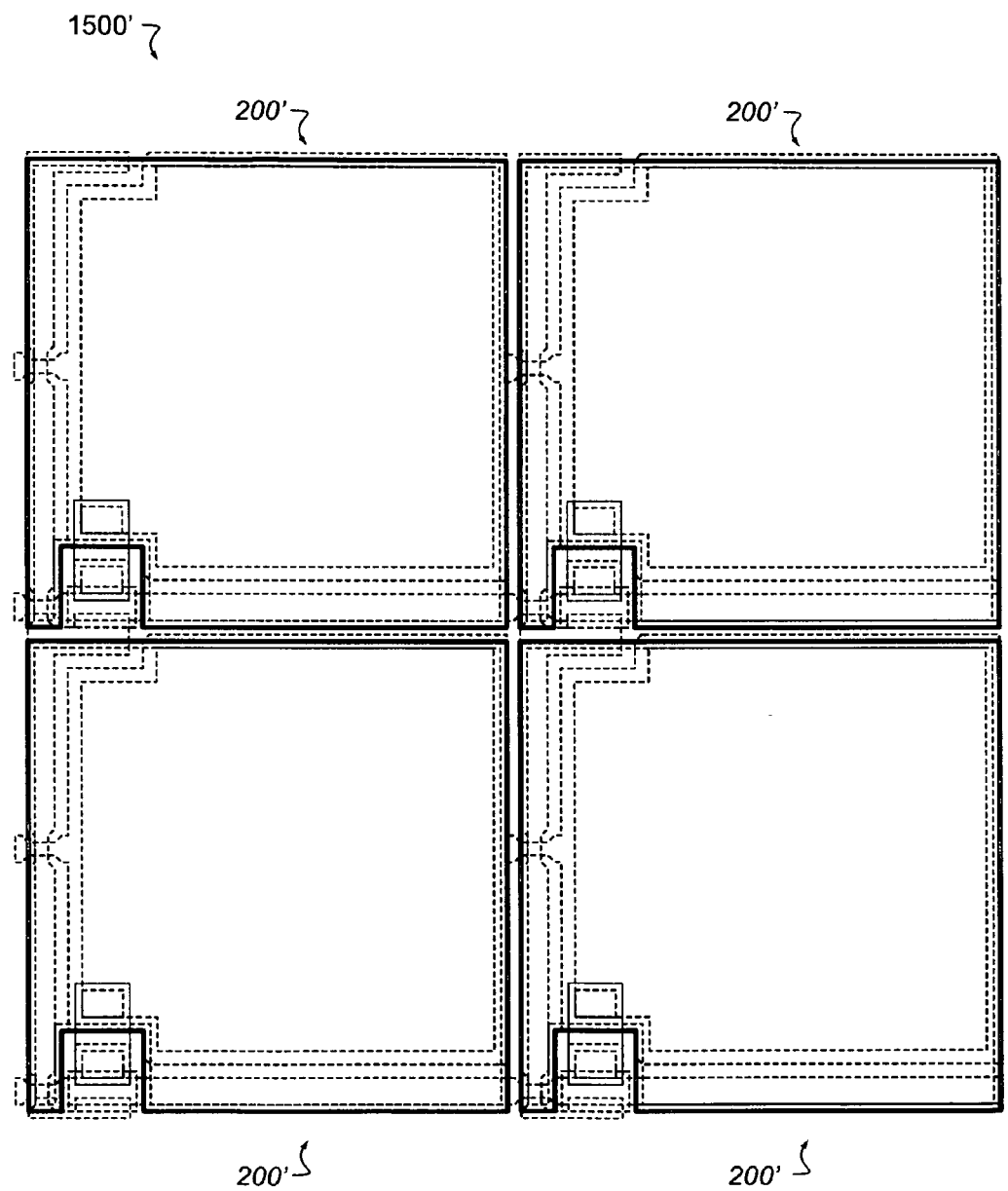
FIG. 15 is a top-down view of an array of pixels according to present teachings.

FIGS. 6A-13A show top-down views and FIGS. 6C-13C show cross-sectional views of a conventional pixel 200 during various steps of a conventional manufacturing process. FIGS. 6B-13B show similar top-down views of pixel 200' according to present teachings and FIGS. 6D-13D show cross-sectional views of pixel 200' corresponding to FIGS. 6B-13B. FIG. 14 is a flow chart illustrating an embodiment of the process according to present teachings shown in FIGS. 6B-13B and FIGS. 6D-13D to manufacture pixel 200'. FIG. 15 illustrates an example imaging array comprising rows and columns of pixels 200'.

It is noted, that the process steps for both pixels (200, 200') include the same basic process steps, but the comparison in views show the difference in pixel structure resulting from these steps. The process and structure will be discussed with reference primarily to pixel 200' using the same basic element numbers to indicate the same features in both pixels, but distinguishing these features with "'" in pixel 200'. It is noted that not all process steps are illustrated or discussed, but the scope of the presently taught embodiments is intended to include any and all obvious variations and additions to the pixel manufacturing process flows shown. Also, except as noted, the materials used for each layer and structure forming pixel 200' can be the same as conventional pixel 200.

As shown in FIGS. 6C-13C to FIGS. 6D-13D, each layer discussed can be formed on, over, or proximate to the previously formed layer, directly or indirectly, respectively. For example, an insulating layer can comprise more than one insulator and a metal layer can comprise more than one metal. Additionally, other layers (not shown) can be formed between the layers illustrated in the figures that are not directly discussed, but are well known in semiconductor processing. Further, FIGS. 6B-13B and 6D-13D illustrate one embodiment of pixel 200' according to the present teachings.

Pixel 200' will be discussed below with reference to an a-Si:H TFT as the switching element and an a-Si:H n-i-p photodiode as the photoelectric conversion element. However, the switching element can be any one or combination (e.g., multiple transistors) of MOS thin-film-transistors, junction field-effect-transistors, fully-depleted SOI transistors, partially-depleted SOI transistors, SiOG transistors, bulk MOS transistors, bi-polar transistors, active circuits (e.g., amplifiers, etc.), etc. Similarly, the photoelectric conversion element can be MIS photosensors, vertical p-n junction photodiodes, lateral p-n junction photodiodes, photoconductors, photo-transistors fabricated from inorganic, organic semiconducting materials, etc.

As one of skill in the art will recognize for indirect X-ray detectors employing photoelectric conversion elements, an X-ray conversion screen, such as CsI or $Gd_2O_2S$:Tb, can be positioned in proximity to the photosensors. Also, for direct X-ray detectors, X-ray sensitive photosensors, such as photoconductors can be employed. Examples of materials for X-ray sensitive photoconductors can include amorphous selenium (a-Se), CdTe, etc.

Figure 6A:
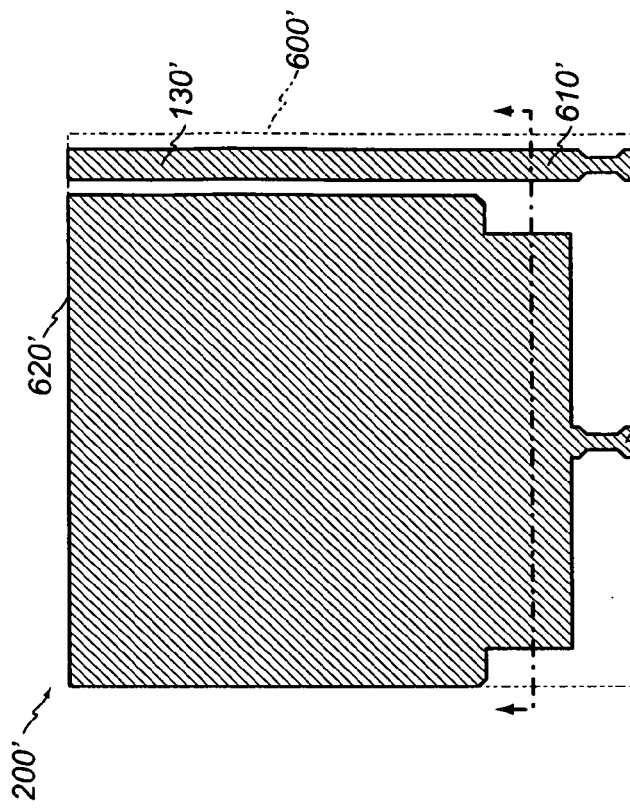
Figure 6B:
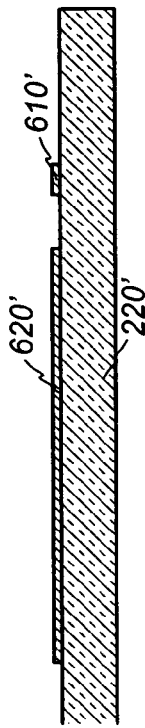
Figure 6C:
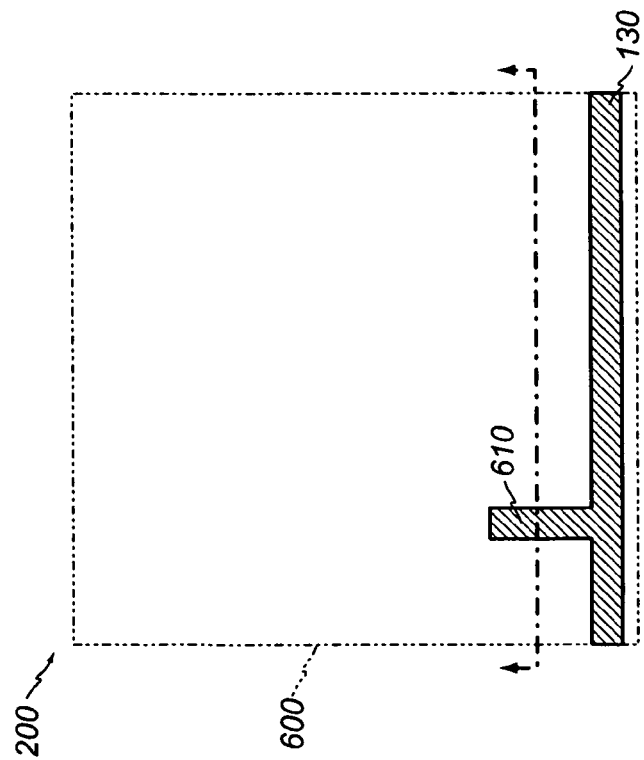
Figure 6D:
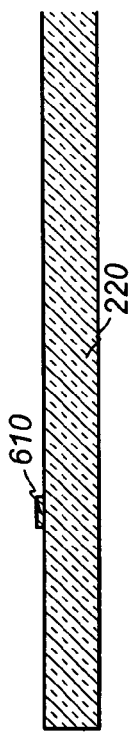

In FIG. 6A-D a scan line 130, 130' can be formed over or proximate to a first surface of substrate 220, 220', respectively. In pixel embodiments 200, 200' shown respectively, the scan line 130, 130' including gate electrode 610, 610'. However, in other pixel embodiments the scan line 130' and gate electrode 610' can be different structures or in different layers (shown in FIGS. 16-18). As shown in FIG. 6B and FIG. 6D, bias line 150' and bias electrode 620' can also be formed at the same time, e.g., during the same metal process step as scan line 130', according to step S1400 of FIG. 14. If scan line 130' and bias line 150' are formed in the same metal layer, then scan line 130' can be substantially parallel to a portion of bias line 150', as shown in FIG. 6B. This parallel configuration can also be present when scan line 130' and bias line 150' are not in the same metal layer (e.g., FIGS. 18A-B). Alternatively, except for the configuration shown in FIG. 6B (formation in the same metal layer), scan line 130' can instead be substantially transverse to a portion of bias line 150' when formed in different metal layers (FIGS. 16 and 18). Bias line 150' can also have portions that can be both parallel and transverse as discussed below (FIGS. 17-18).

In addition, bias line 150' (including bias electrode 620') can be between the first surface of substrate 220' and a first terminal (bottom electrode 1000') (not shown) of the photoelectric conversion element 120' (not shown). Scan line 130' and bias electrode 620' can have a minimum clearance of about 3 µm, or a minimum feature clearance based on the specific process technology. Scan line 130', bias line 150', and bias electrode 620' of pixel 200' can be deposited and/or etched using a different mask than scan line 130 of pixel 200. Scan line 130' can have a width of about 8 µm with about a 3 µm clearance spacing and about a 5 µm clearance spacing (not shown) between adjacent pixels 200' (e.g., in the imaging array shown in FIG. 15).

Bias electrode 620' can be formed by depositing a large area (e.g., >pixel pitch×minimum feature size) of metal and may vary in size depending on design specifications. In FIG. 6B and FIG. 6D, the bias electrode 620' is shown having a relatively large area in part because the larger area can provide improved photodiode topology, decrease bias line resistance, and increase thermal conduction to improve pixel heat dissipation. Scan line's 130' width can also be increased to reduce the scan line's 130' resistance. The photoelectric conversion element 120' (not shown) can cover or be proximate to at least a portion of scan line 130'.

Figures 7A, 7B, 7C, 7D:
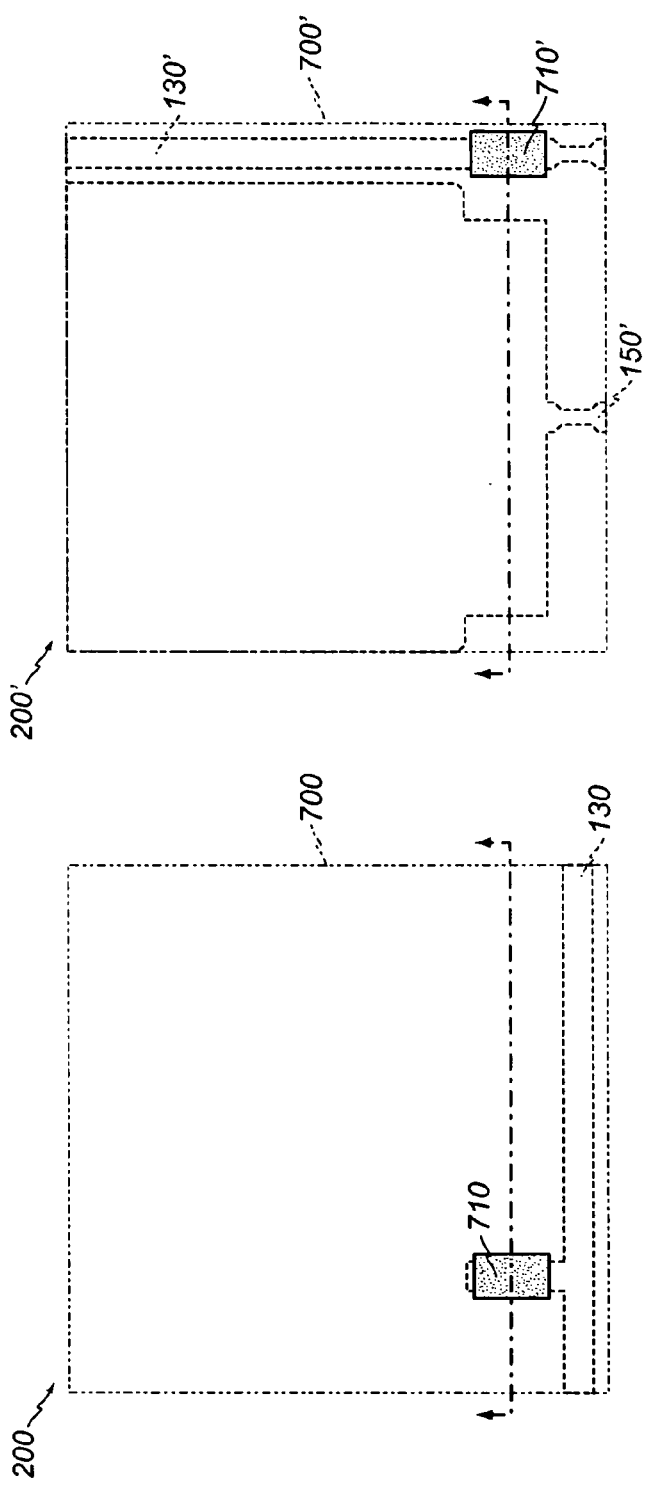

In FIG. 7B and FIG. 7D, TFT gate insulating layer 700' is shown formed over or proximate to the entire surface of the substrate 220' including scan line 130' and bias electrode 620' in step S1405, e.g., to cover the scan line 130', bias electrode 620', gate electrode 610', bias line 150', and any exposed surface of substrate 220'. Gate insulating layer 700' can be a non-stoichiometric silicon nitride (a-$SiN_x$:H), or other types of insulating layers, e.g., oxides, etc., either single or stacked, as known in the art. The TFT active layer 710' and doped contact layer 720' can be formed over or proximate to the entire surface of the substrate 700' after the formation of the gate insulating layer 700', e.g., through PECVD deposition of intrinsic and doped a-Si:H. The TFT active island can be formed by patterning the active layer 710' and doped contact layer 720', e.g. through patterning by dry etching, etc., according to step S1410.

The deposition of these layers, gate insulator 700', active layer 710', and doped contact layer 720', shown in FIG. 7D can be formed consecutively before patterning to form the active island according to step S1405. Alternatively, formation of the active layer 710' and doped contact layer 720', can be formed after patterning the gate insulator layer 700' (not shown). With the gate insulator layer 700', active layer 710', and doped contact layer 720' formed consecutively, the patterning of the gate insulator layer 700' can be performed after the formation of the TFT active island.

As seen in FIG. 7D, an a-Si:H TFT 110' (not shown completed) is going to be formed over a surface of substrate 220' where the active region of the a-Si:H TFT is over or proximate to, and aligned with, scan line 130'. Portions of the scan line 130', as shown in FIG. 6B and FIG. 6D, and FIG. 7B and FIG. 7D, can be between the active layer 710' and a surface of substrate 220', and can be considered as the TFT gate electrode 610'. Due to the widths of scan line 130' and the source and drain (not shown) of TFT 110', the overlap tolerance of pixel 200' can be reduced from conventional pixel 200. For example, the overlap tolerance can be about 2 μm for pixel 200' as compared to about 3 μm for conventional pixel 200. Alternatively, if the overlap remains at about 3 μm for pixel 200', the portion of scan line 130' that TFT 110' (not shown) can cover can be enlarged by about 2 μm to maintain the same channel length. Present teachings include embodiments in which TFT gate insulator layer 700' can be patterned to form a via window for bias line 150' prior to the formation of the TFT terminal metal or the via window can be formed later in the process.

Figure 8A:
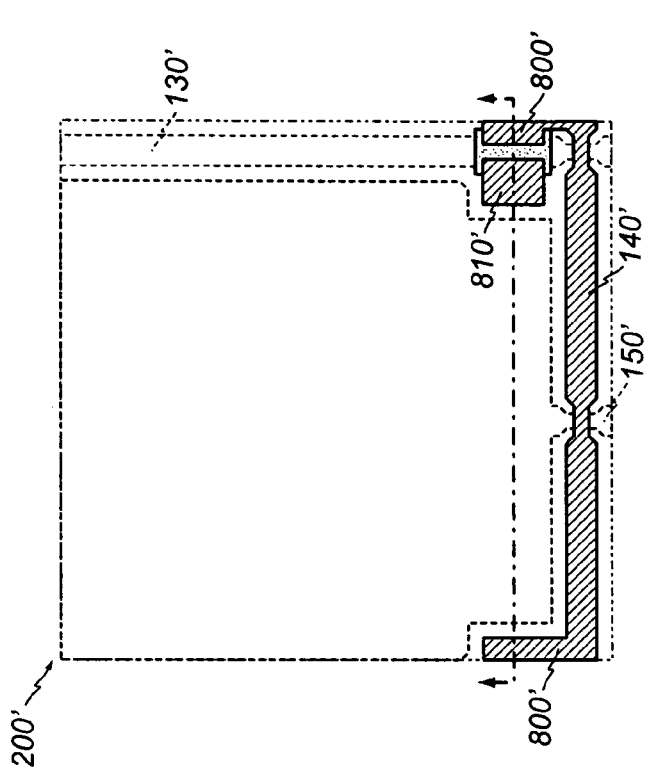
Figure 8B:
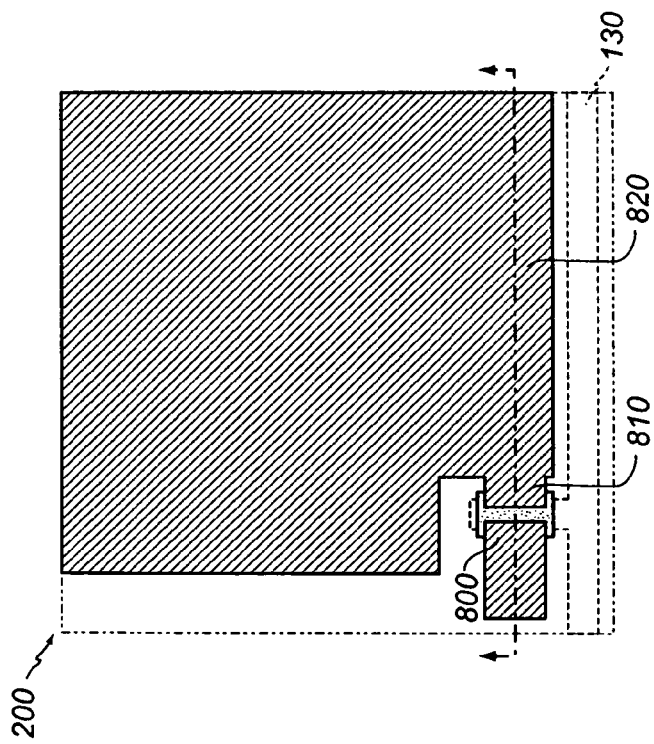
Figure 8C:
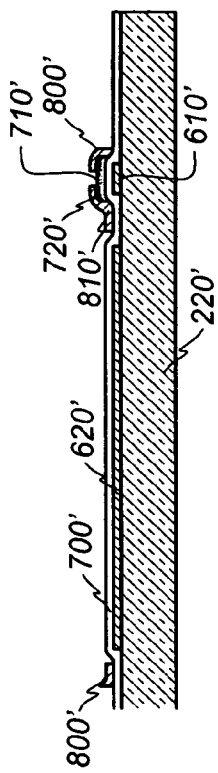
Figure 8D:
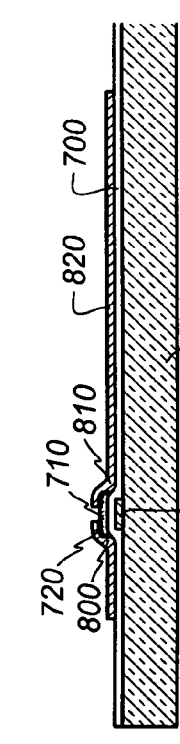

FIGS. 8B and 8D show the formation of two terminals of the switching element TFT 110'; terminal 810' can connect to photoelectric conversion element 120' (not shown), and terminal 800' can connect to data line 140' over or proximate to a surface portion of the active layer (a-Si:H) 710' and aligned with scan line 130', according to step S1415. Regions of the doped contact layer 720' between the two TFT terminals can be removed and portions of the active layer 710' can also be removed during step S1415. Data line 140' can also be formed in this layer, and is shown substantially perpendicular to scan line 130' in FIG. 8B. Alternatively, in other embodiments, data line 140' can be formed in the top metal layer (not shown) instead of the TFT terminal metal layer as shown.

Figure 9A:
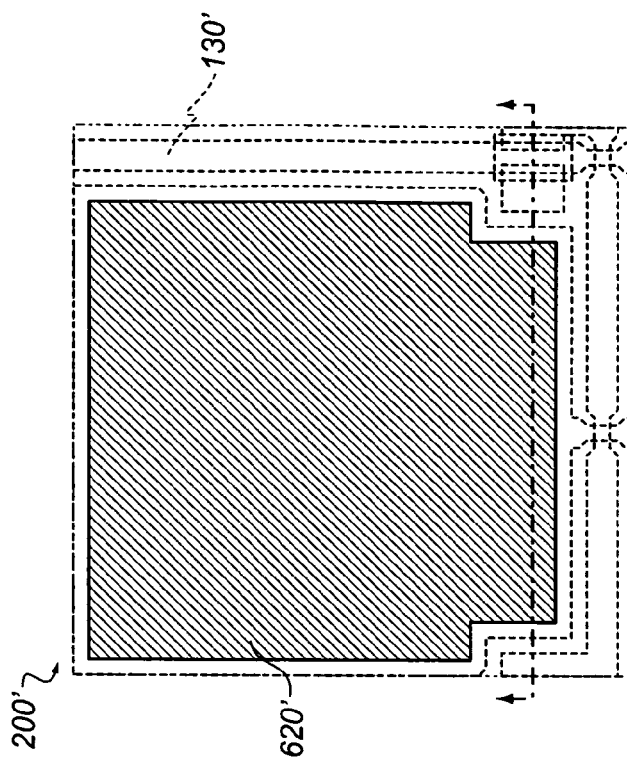
Figure 9B:
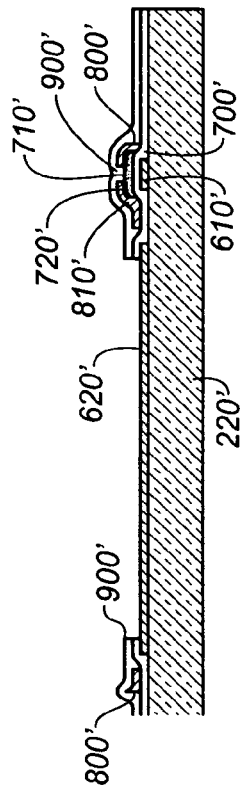
Figure 9C:
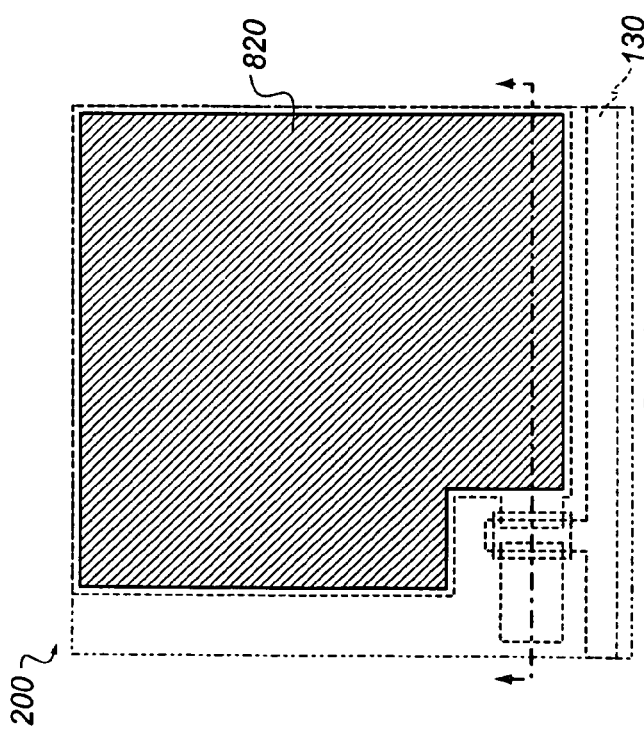
Figure 9D:
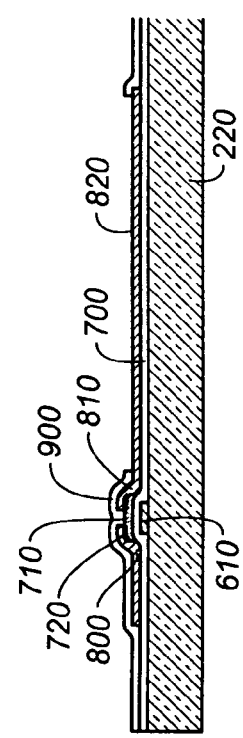

FIG. 9B and FIG. 9D complete the fabrication of TFT switching element 110' by forming a relatively thick TFT passivation layer 900', e.g. over the entire surface of the previously formed features as shown and according to step S1420. Passivation layer 900' and gate insulating layer 700' (if not previously etched) can be etched to form a contact window for a terminal of the photoelectric conversion element 120' (not shown) to electrically connect bias electrode 620' of pixel 200' to one terminal of the photoelectric conversion element 120' (not shown) according to step S1425.

Figure 10A:
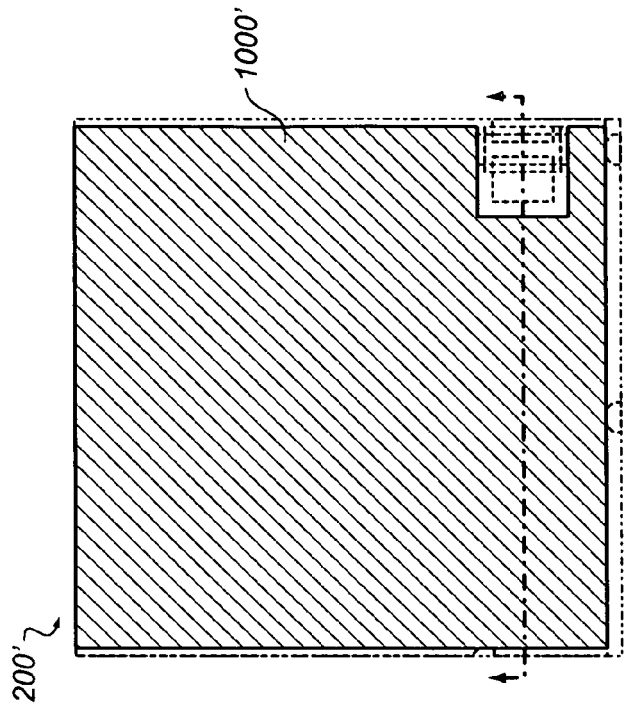
Figure 10B:
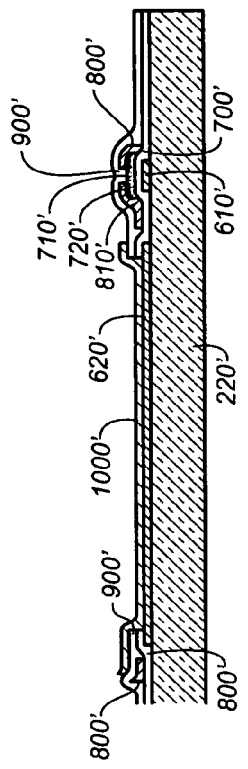
Figure 10C:
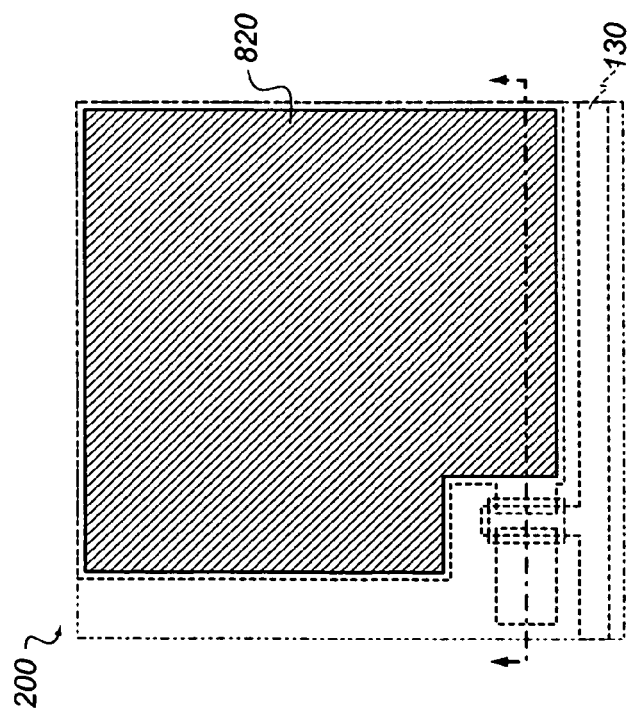
Figure 10D:
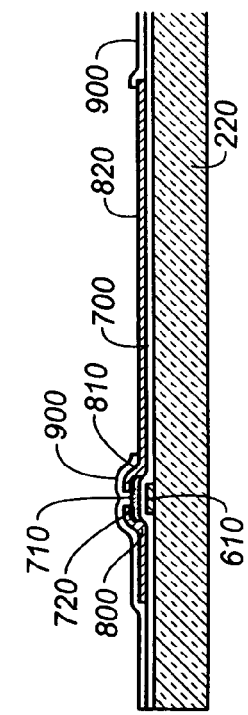

An additional metal step can be added as shown in FIG. 10D and according to step S1430. Direct deposition of n+ a-Si:H on top of TFT passivation 900' can cause processing issues, therefore an additional metal layer 1000' can be used to cover bias electrode 620' as shown. While FIGS. 10B and FIG. 10D show a step corresponding to S1430, the conventional process does not usually include this additional metal layer and therefore pixel 200 is shown without this additional metal layer.

FIG. 11B and FIG. 11D show the resulting pixel 200' after the formation of the sensor stack 1100' and top electrode 1140' according to step S1435. Since in the embodiment shown, the photoelectric conversion element is an a-Si:H n-i-p photodiode, the sensor stack 1100' comprises n+ doped a-Si:H 1110', intrinsic a-Si:H 1120', and p+ doped a-Si:H 1130'. The n-i-p designation refers to the deposition order of the layers. If p+ a-Si:H is deposited first, the photodiode would be referred to as p-i-n. The formation of the top transparent electrode 1140' and the sensor stack 1100' can use two different masks.

As shown in the top-down view of FIG. 11B, the photoelectric conversion element 120', which includes the sensor stack 1100' can overlap at least a portion of scan line 130' as long as the overlap spacing is within a design rule tolerance between each pixel 200', which can increase the pixel fill factor. The pixel 200' shown in FIG. 11B and FIG. 11D illustrates a maximum fill factor design embodiment for a coplanar pixel, however the portion of the sensor stack 1100' that overlaps the scan line 130' can be varied as required by design specifications. The sensor stack 1100' can also cover at least a portion of data line 140' instead of a portion of scan line 130'. In alternative embodiments, the sensor stack 1100' can cover both a portion of scan line 130' and a portion of data line 140', if the data line is routed in the same metal layer as the TFT source/drain terminals. This structure can also provide a boosted fill factor.

Another layer of passivation 1200', e.g., sensor passivation, can be formed over the surface of the previously formed features of pixel 200', as shown in FIG. 12B and FIG. 12D and according to step S1440. Also shown in FIG. 12B and FIG. 12D, sensor passivation via window 1210' can be opened by e.g., dry etching, according to step S1445. Note that if the data line 140' is routed in the top metal (not shown), an additional via (not shown) window can be etched to connect a terminal of the TFT 800' to the data line 140'. This case is shown in FIG. 12A and FIG. 12C where a passivation window 1210 is opened for one terminal of the TFT (not directly connected to the photodiode terminal) 800 to connect to the data line 130 routed in a top metal layer. FIG. 13B and FIG. 13D show the top metal 1300' filling the previous via openings 1210'. For pixel 200', TFT terminal 810' to photodiode terminal 1140' connection 820' (as a floating signal node connection 160') is formed according to step S1450, as compared to pixel 200 in which the top metal layer forms data line 140 and bias line 150 as shown in FIG. 13A and FIG. 13C. One advantage of the presently taught embodiments can be that the bias line routing on top of the photoelectric conversion element (as shown in FIG. 13A and FIG. 13C) is voided, which can increase the fill factor and also release stress on top of the photodiode.

Pixel 200' processing can continue with additional depositions and etchings, e.g., passivation, planarization, anti-reflection coating, forming periphery connections, etc., according to step S1455 and as well known in the art. It is noted that periphery connections can be formed during the above discussed process or after the forming of the pixels. In addition, as will be understood by one of ordinary skill in the art, additional layers of inorganic or organic dielectrics can be deposited and patterned for encapsulation and to improve optical performance of the formed imaging arrays. Additional layers of conductors, such as ITO, can be deposited and patterned for imaging array pad bonding purposes.

Since a large portion of the floating node 160' is now located at the top of the photoelectric conversion element in the presently taught embodiments, i.e., further from scan line 130', the amount of capacitance coupling from the scan line 130' to this node can be decreased.

FIG. 15 shows a 2×2 tiling 1500' of pixels 200' according to present teachings. The process for forming each pixel 200' of array 1500' is the same as described with reference to a single pixel 200' above, but extended over a larger substrate. The pixels 200' forming array 1500' can be electrically coupled to one another, e.g., by a common scan lines 130', data lines 140', bias lines 150', etc. As shown in FIG. 15, a portion of data line 140' can become part of the TFT terminal for an adjacent pixel 200' (which is also illustrated by FIGS. 8B and 8D).

Figure 16A:
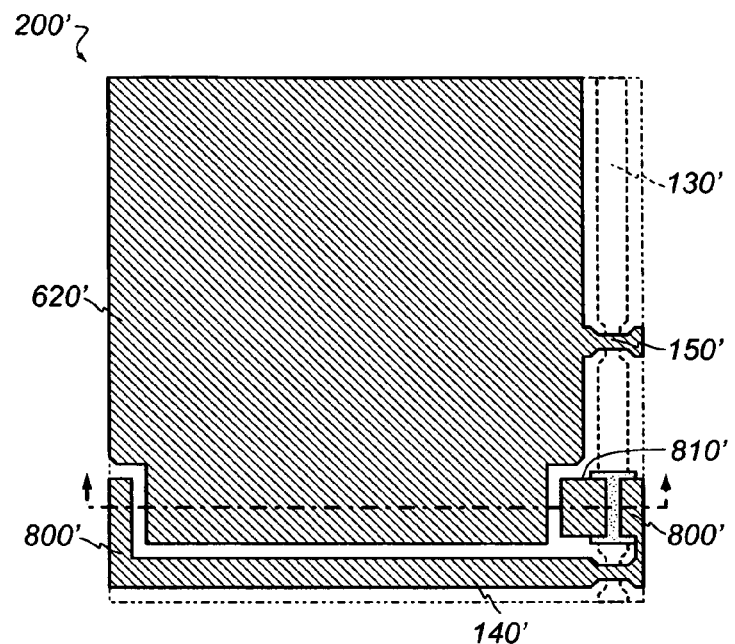
FIG. 16A shows a top-down view of another embodiment of a pixel according to present teachings.
Figure 16B:
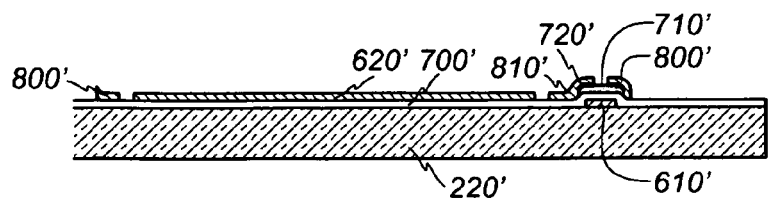
FIG. 16B shows a cross-sectional view of the pixel of FIG. 16A.

Additional embodiments present pixel architectures based on the present teachings where the bias line 150' is no longer routed in the same metal layer as scan line 130'. Instead, bias line 150' can be routed in the TFT source/drain metal layer as shown in FIG. 16A and FIG. 16B. As shown in FIG. 6B and FIG. 15 of the previously described embodiment, bias line 150' can be routed in parallel with scan line 130'. However, as shown in FIGS. 16A-B, bias line 150' can be routed in a direction parallel to data line 140'. Alternatively, as discussed above, bias line 150' can be routed to be parallel to both scan line 130' and data line 140' if data line 140' is not routed in the same layer as the TFT's 110' source/drain metal.

Also, wider bias line or meshed bias line (e.g., both parallel and transverse) routing can reduce the loop area, which can provide better EMI immunity caused by external sources.

This embodiment can use two metal layers, scan line 130' and TFT 110' source/drain for bias line routing. Multiple metal layer routing for the bias line can reduce the bias line resistance as well as improve the reliability of the pixels and image arrays comprising a plurality of pixels. Additionally, meshed bias line routing can help improve thermal conduction, which can alleviate heat introduced in a radiation imager. Furthermore, meshed bias line routing can allow additional flexibility in the peripheral connections of the bias lines. Bottom bias line routing can resolve poor step coverage over thick photoelectric conversion elements due to over etching of the top metal layer, and/or stress introduced on top of the photoelectric conversion elements in an imaging array. Additionally, to decrease the data line capacitance, the bias line width can be reduced to enlarge the gap between the bias line 150' and the data line 140', as well as reduce the crossover area proximate the scan line 130'.

Figure 17A:
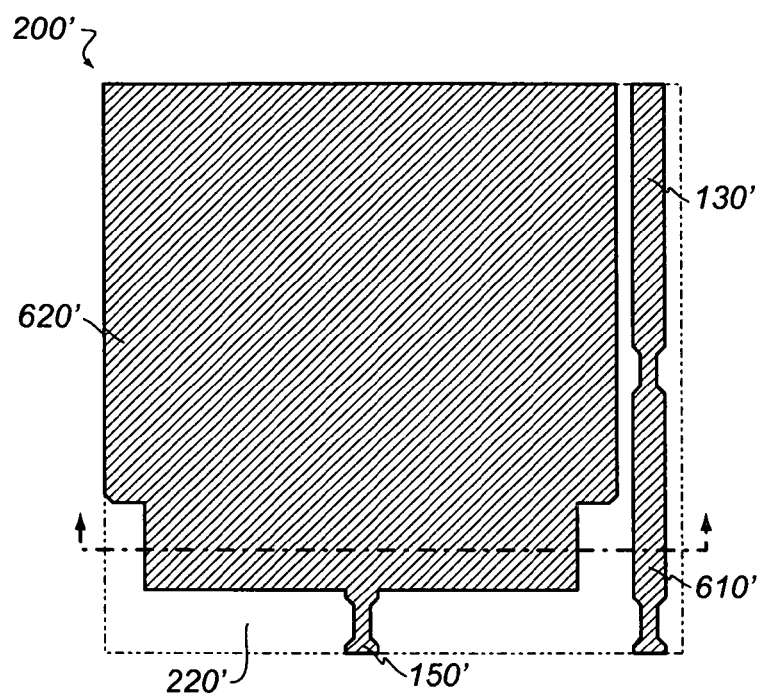
FIG. 17A shows a top-down view of another embodiment of a pixel according to present teachings.
Figure 17B:
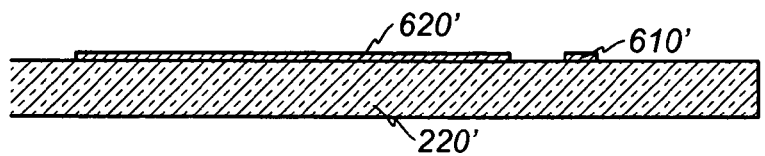
FIG. 17B shows a cross-sectional view of the pixel of FIG. 17A.
Figure 18A:
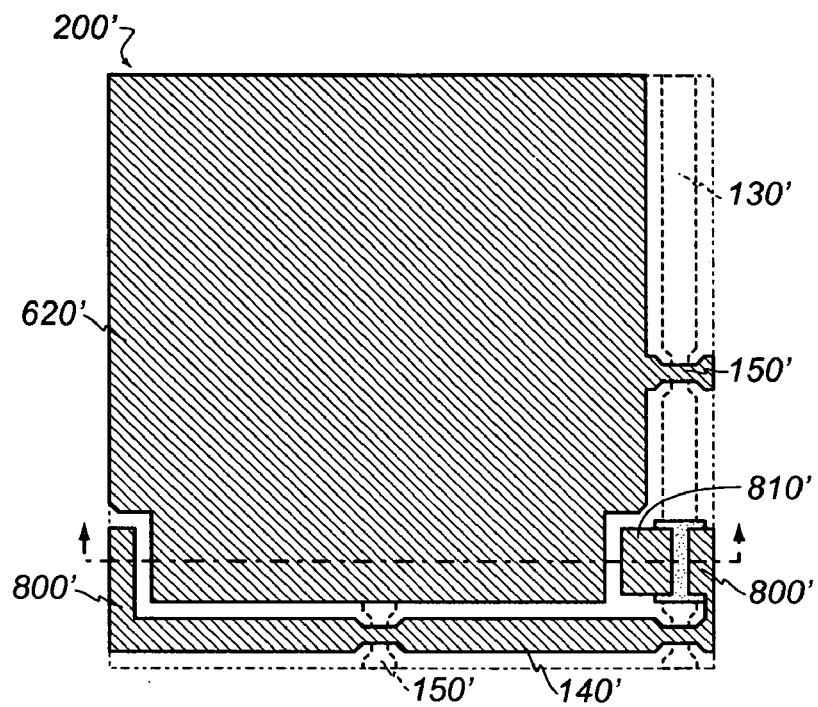
FIG. 18A shows a top-down view of the pixel embodiment of FIG. 17A at a later step in the manufacturing process according to present teachings.
Figure 18B:
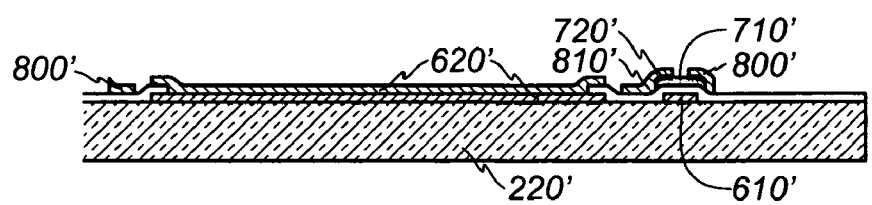
FIG. 18B shows a cross-sectional view of the pixel embodiment of FIG. 17B at a later step in the manufacturing process according to present teachings.

As shown in FIGS. 17A-B, bias line 150' and bias electrode 620' can be deposited in a similar manner as shown in FIGS. 6A and 6D. However, in FIGS. 17A-B another layer of metal can be deposited proximate the previously formed bias electrode 620' (e.g., similar to additional metal layer 1000') in the step where TFT terminals 800' and 810' are formed. Also, in this step, a second bias line 150' (transverse to a portion of scan line 130') can be formed. Thus, as shown in FIGS. 18A-B, the bias electrode 620' comprises two metal layers and two bias lines 150', one bias line 150' parallel to and one bias line 150' transverse to portions of scan line 130'.

It should be noted that the present teachings are not intended to be limited in scope to the embodiments illustrated in the figures.

While the invention has been illustrated with respect to one or more implementations, alterations and/or modifications can be made to the illustrated examples without departing from the spirit and scope of the appended claims. For example, the various pixel embodiments can be used in radiation imaging systems. An example radiation imaging system can include a plurality of the various pixel embodiments in an array, driving circuits, readout circuits, and a phosphor screen. A radiation source can also be included.

In addition, while a particular feature of the invention can have been disclosed with respect to only one of several implementations, such feature can be combined with one or more other features of the other implementations as can be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected.

Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed can be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A pixel, comprising:
    a scan line proximate to a first surface of a substrate;
    a bias line between the first surface of the substrate and a first terminal of a photoelectric conversion element, wherein the bias line is substantially parallel to the scan line;
    a switching element proximate to the first surface of the substrate and aligned with at least a portion of the scan line, comprising:
        a first terminal;
        a second terminal; and
        a gate electrode electrically coupled to the scan line, wherein the first terminal and the second terminal are electrically coupled based on a scan signal from the scan line; and
    the photoelectric conversion element proximate to the first surface of the substrate and aligned with at least a portion of the bias line, comprising:
        the first terminal electrically coupled to the bias line; and
        a second terminal electrically coupled to the first terminal of the switching element.

2. The pixel of claim 1, wherein a second bias line is transverse to another portion of the scan line.

3. The pixel of claim 1, wherein a fill factor for the pixel is between about 70% and about 89%.

4. The pixel of claim 1, wherein the bias line and the scan line are formed in a same metal layer.

5. The pixel of claim 4, wherein the gate electrode is formed in the same metal layer as the bias line and the scan line.

6. The pixel of claim 1, wherein a portion of the photoelectric conversion element is proximate to at least one of a portion of the scan line, a portion of a data line, and a combination thereof.

7. The pixel of claim 1, wherein the bias line is wider than the scan line.

8. The pixel of claim 1, wherein the photoelectric conversion element is selected from the group of: n-i-p photodiodes, p-n junction photodiodes, MIS photosensors, and phototransistors.

9. The pixel of claim 1, wherein the switching element is selected from the group of: MOS thin-film-transistors, junction field-effect-transistors, fully-depleted SOI transistors, partially-depleted SOI transistors, SiOG transistors, bulk MOS transistors, and bi-polar transistors.

10. The pixel of claim 1, wherein the photoelectric conversion element includes at least one semiconducting layer, and that at least one semiconducting layer is selected from the group of: amorphous silicon, micro-crystalline silicon, poly-crystalline silicon, single-crystal silicon, an organic semiconductor, and metal oxide semiconductors.

11. The pixel of claim 1, wherein the switching element includes at least one semiconducting layer, and the at least one semiconducting layer is selected from the group of amorphous silicon, micro-crystalline silicon, poly-crystalline silicon, single-crystal silicon, an organic semiconductor, and metal oxide semiconductors.

12. The pixel of claim 1, wherein the first terminal of the photoelectric conversion element is a cathode and the second terminal of the photoelectric conversion element is an anode.

13. The pixel of claim 1, wherein the first terminal of the photoelectric conversion element is an anode and the second terminal of the photoelectric conversion element is a cathode.

14. The pixel of claim 1, further comprising an additional metal layer between the bias line and the photoelectric conversion element.

15. An imaging array comprising a plurality of pixels electrically connected in rows and columns according to claim 1, wherein the scan line and the bias line are common to the plurality of pixels.

16. A radiation imaging system comprising:
at least one imaging array comprising: a plurality of pixels according to claim 1, driving circuits, and readout circuits; and
a phosphor screen configured to convert radiation into light proximate to the plurality of pixels.

17. The radiation imaging system of claim 16, further comprising a radiation source for generating radiation.

18. A pixel, comprising:
a scan line proximate to a first surface of a substrate;
a bias line between the first surface of the substrate and a first terminal of a photoelectric conversion element, wherein the bias line is substantially transverse to a portion of the scan line;
a switching element proximate to the first surface of the substrate and aligned with at least a portion of the scan line, comprising:
a first terminal;
a second terminal; and
a gate electrode electrically coupled to the scan line, wherein the first terminal and the second terminal are electrically coupled based on a scan signal from the scan line; and
the photoelectric conversion element proximate to the first surface of the substrate and aligned with at least a portion of the bias line, comprising:
the first terminal electrically coupled to the bias line; and
a second terminal electrically coupled to the first terminal of the switching element.

19. The pixel of claim 18, wherein a portion of the photoelectric conversion element is proximate to at least one of a portion of the scan line, a portion of a data line, and a combination thereof.

20. The pixel of claim 18, wherein the bias line is wider than the scan line.

21. The pixel of claim 18, wherein the photoelectric conversion element is selected from the group of: n-i-p photodiodes, p-n junction photodiodes, MIS photosensors, and phototransistors.

22. The pixel of claim 18, wherein the switching element is selected from the group of: MOS thin-film-transistors, junction field-effect-transistors, fully-depleted SOI transistors, partially-depleted SOI transistors, SiOG transistors, bulk MOS transistors, and bi-polar transistors.

23. The pixel of claim 18, wherein the photoelectric conversion element includes at least one semiconducting layer, and the at least one semiconducting layer is selected from the group of: amorphous silicon, micro-crystalline silicon, poly-crystalline silicon, single-crystal silicon, an organic semiconductor, and metal oxide semiconductors.

24. The pixel of claim 18, wherein the switching element includes at least one semiconducting layer, and the at least one semiconducting layer is selected from the group of amorphous silicon, micro-crystalline silicon, poly-crystalline silicon, single-crystal silicon, an organic semiconductor, and metal oxide semiconductors.

25. The pixel of claim 18, wherein the first terminal of the photoelectric conversion element is a cathode and the second terminal of the photoelectric conversion element is an anode.

26. The pixel of claim 18, wherein the first terminal of the photoelectric conversion element is an anode and the second terminal of the photoelectric conversion element is a cathode.

27. The pixel of claim 18, further comprising an additional metal layer between the bias line and the photoelectric conversion element.

28. An imaging array comprising a plurality of pixels electrically connected in rows and columns according to claim 18, wherein the scan line and the bias line are common to the plurality of pixels.

* * * * *